(12) United States Patent
Yamada (10) Patent No.: US 8,559,771 B2
(45) Date of Patent: Oct. 15, 2013

(54) SOLID STATE IMAGE SENSOR

(75) Inventor: Daisuke Yamada, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 180 days.

(21) Appl. No.: 13/294,829

(22) Filed: Nov. 11, 2011

(65) Prior Publication Data

US 2012/0120288 A1    May 17, 2012

(30) Foreign Application Priority Data

Nov. 17, 2010   (JP) .................................. 2010-257250

(51) Int. Cl.
*G02B 6/00*      (2006.01)
(52) U.S. Cl.
USPC ............. 385/12; 348/272; 348/273; 348/294; 348/E09.003; 250/208.1
(58) Field of Classification Search
USPC ............ 385/12; 348/294, 272, 273, E09.003; 250/208.1
See application file for complete search history.

(56) References Cited

U.S. PATENT DOCUMENTS

| | | | |
|---|---|---|---|
| 4,950,318 A * | 8/1990 | Dyott .............................. | 65/403 |
| 6,459,838 B1 * | 10/2002 | Varner .......................... | 385/123 |
| 2004/0051832 A1 * | 3/2004 | Shimoshikiryoh ........... | 349/117 |
| 2004/0151450 A1 * | 8/2004 | Wadsworth et al. .......... | 385/123 |

FOREIGN PATENT DOCUMENTS

JP           2007-086720 A      4/2007

* cited by examiner

*Primary Examiner* — Ellen Kim
(74) *Attorney, Agent, or Firm* — Canon U.S.A., Inc. IP Division

(57) ABSTRACT

A solid state image sensor includes an extracting unit including a plurality of pixels, each having an optical waveguide formed by a core and a clad for guiding incident light entering the pixel to a photoelectric converter section via the core. The extracting unit is formed by at least two pixels including a first pixel and a second pixel and the cores in the optical waveguides of the first and second pixels are designed to show an oblate cross section and arranged with their respective major axes disposed in different directions.

14 Claims, 9 Drawing Sheets

SOLID STATE IMAGE SENSOR

BACKGROUND OF THE INVENTION

1. Field of the Invention

The present invention relates to a solid state image sensor. More particularly, the present invention relates to a solid state image sensor to be used for a digital still camera a digital video camera, etc.

2. Description of the Related Art

Currently, polarization filters are being employed to acquire or remove polarization information in a digital still camera or a digital video camera.

For example, a polarization filter is fitted to the lens of a camera in order to attenuate unnecessary reflected light that arises at an interface such as a glass surface or a water surface and an image is picked up by removing specific polarized light.

With optical interferometric measurement, an interference image having a specific phase difference is acquired by adjusting a polarization filter.

In either case, a polarization filter is inserted into a front face of a solid state image sensor to detect polarization information, because the solid state image sensor detects only luminance information of light but cannot acquire polarization information.

Then, the entire solid state image sensor receives only light transmitted through the polarization filter. Therefore, if plural pieces of polarization information are required, the solid state image sensor is required to operate plural times to pick up images.

If a solid state image sensor can detect plural pieces of polarization information, the solid state image sensor can acquire polarization information on an image of a subject without using a polarization filter.

Japanese Patent Application Laid-Open No. 2007-086720 proposes a technique of using a polarization filter array made of photonic crystal and arranged on the pixels of a solid state image sensor for the purpose of making the solid state image sensor able to detect plural pieces of polarization information.

However, a polarization filter array made of photonic crystal as described in Japanese Patent Application Laid-Open No. 2007-086720 cannot be fabricated with a size of several micrometers that is substantially equal to the size of downsized small pixels that have become popular in recent years. Additionally, the number of periods in a photonic crystal is small, hence resulting in poor polarization splitting characteristics.

Additionally, the process of manufacturing a solid state image sensor equipped with a polarization filter array requires additional steps relative to a conventional process for precisely aligning a polarization filter array with the pixels of the solid state image sensor, which can be conducted only with difficulty, hence resulting in high manufacturing cost.

SUMMARY OF THE INVENTION

According to the present invention, a solid state image sensor including an extracting unit including a plurality of pixels, each having an optical waveguide formed by a core and a clad for guiding incident light entering the pixel to a photoelectric converter section via the core; the extracting unit is formed by at least two pixels including a first pixel and a second pixel, the cores in the optical waveguides of the first and second pixels is designed to show an oblate cross section and arranged with their respective major axes disposed in different directions; the extracting unit is designed to show a light-receiving efficiency varying as a function of polarization state of incident light entering the first and second pixels.

Further features of the present invention will become apparent from the following description of exemplary embodiments with reference to the attached drawings.

BRIEF DESCRIPTION OF THE DRAWINGS

FIGS. 2A and 2B are schematic illustrations of pixels of the solid state image sensor according to the first embodiment of the present invention.

FIGS. 4A and 4B are schematic illustrations of a process of determining the polarized components of incident light entering the solid state image sensor of the first embodiment.

FIGS. 8A and 8B are schematic illustrations of pixels of the solid state image sensor according to the third embodiment of the present invention.

DESCRIPTION OF THE EMBODIMENTS

Preferred embodiments of the present invention will now be described in detail in accordance with the accompanying drawings.

According to the present invention, polarization information on incident light is obtained by forming an optical waveguide with cores having an oblate cross section so as to exploit the characteristic that the coupling efficiency of incident light with an optical waveguide varies as a function of polarized light and arranging a plurality of pixels with cores having an oblate cross section in such a way that major axes of the cores are sequentially turned.

With this arrangement, a solid state image sensor that can obtain a sufficient amount of polarization information without requiring a polarization filter to be inserted into and aligned with the image sensor can be manufactured with ease at low cost without using an additional manufacturing process.

Now, the present invention will be described by way of embodiments. Throughout the drawings that illustrate the

First Embodiment

Figure 1:
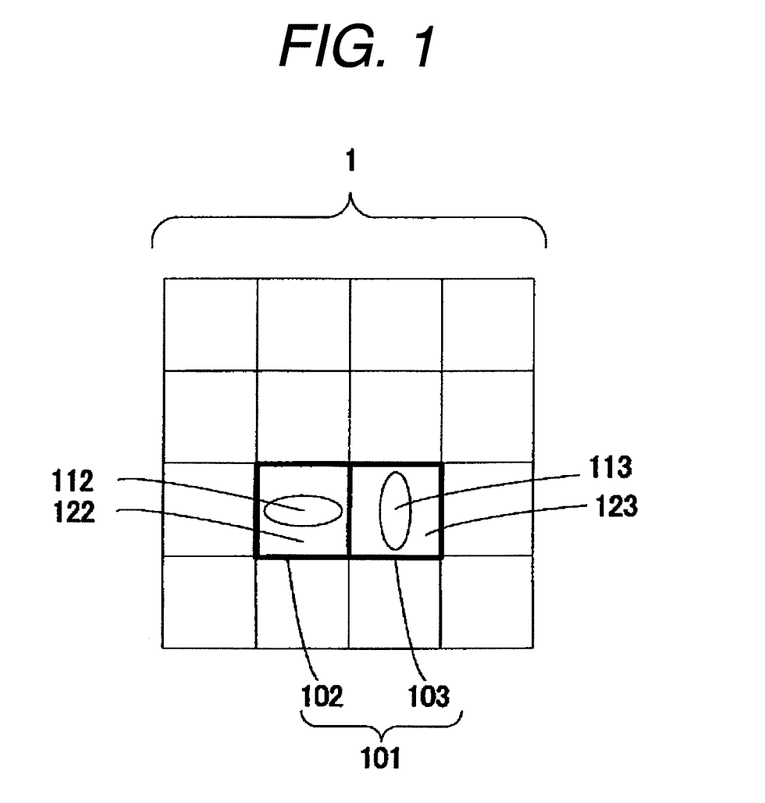
FIG. 1 is a schematic top view of the solid state image sensor according to the first embodiment of the present invention.

The configuration example of a solid state image sensor formed by applying the present invention will be described below as the first embodiment. FIG. 1 is a schematic top view of the solid state image sensor 1 including polarized light extracting units 101.

Each polarized light extracting unit 101 is formed by two pixels including a first pixel 102 and a second pixel 103 that are arranged side by side.

The first pixel 102 has a first optical waveguide including a core 112 and a clad 122, whereas the second pixel 103 has a second optical waveguide including a core 113 and a clad 123. Note that the cores of the optical waveguides are formed by means of a material having a refractive index higher than that of the clads of the optical waveguides. The core 112 of the first pixel 102 and the core 113 of the second pixel 103 show an elliptic cross section and are so arranged that their major axes are angularly shifted by 90° from each other.

Figure 2A:
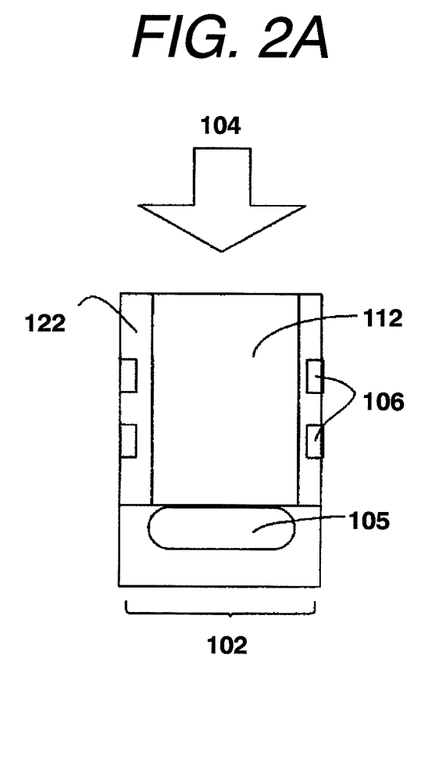
FIG. 2A is a schematic cross-sectional view of the first pixel and FIG. 2B is a schematic cross-sectional view of the second pixel.
Figure 2B:
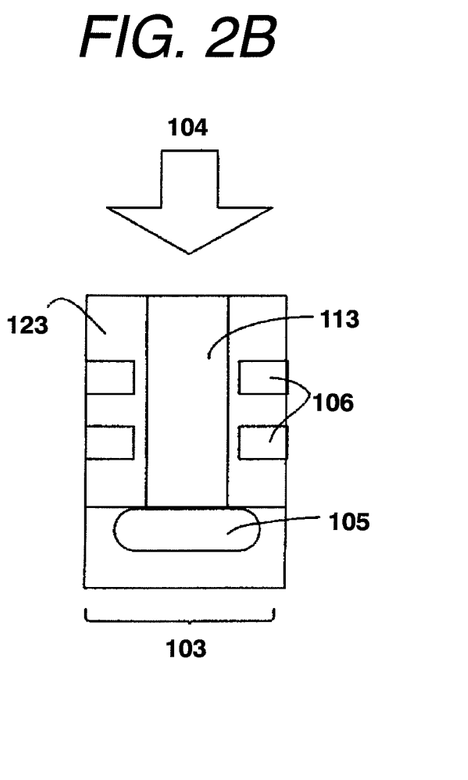

FIG. 2A is a schematic cross-sectional view of the first pixel 102 and FIG. 2B is a schematic cross-sectional view of the second pixel 103. Beams of incident light 104 that enter the respective pixels 102 and 103 are partly coupled into the respective optical waveguides and propagated through the cores 112 and 113 and arrive at respective photoelectric converter sections 105.

The arriving light beams are converted into respective electric signals by the photoelectric converter sections 105 so that luminance information on them can be obtained.

With this arrangement, light confined in the cores can be efficiently propagated to the photoelectric converter sections 105.

A light-absorbing section 106 is arranged at the clad of each optical waveguide. Note that the light-absorbing section 106 may be so designed as to operate also as wiring for controlling the signals of the photoelectric converter section.

Since the cores of the pixels 102 and 103 are made to show an oblate (elliptic) cross section, the coupling efficiency of incident light 104 and each of the optical waveguides varies as a function of the polarized component of incident light 104.

Since light that is propagated through each of the cores is efficiently guided to the corresponding photoelectric converter section, the ratio of incident light 104 that gets to the photoelectric converter section 105 (light-receiving efficiency) is determined by the coupling efficiency.

The net result is that, as the coupling efficiency varies as a function of polarized light, the light-receiving efficiency of each of the pixels 102 and 103 varies according to the polarization state of incident light 104.

Additionally, since the major axis of the core 112 of the first pixel 102 and that of the core 113 of the second pixel 103 are made to face respective directions that are different from each other, the light-receiving efficiency of the first pixel and that of the second pixel differ from each other relative to a specific polarized component (X-polarized light) of incident light.

Similarly, the light-receiving efficiency of the first pixel and that of the second pixel differ from each other relative to another specific polarized component (Y-polarized light) of incident light that is orthogonal relative to X-polarized light.

Thus, polarization information on light entering the polarized light extracting unit 101 can be obtained on the basis of that the light-receiving efficiency of the first pixel 102 and that of the second pixel 103 vary as a function of polarized light and by utilizing the light-receiving efficiency of the first pixel 102 and that of the second pixel 103 that differ from each other.

An exemplar processing method for acquiring polarization information on light entering the polarized light extracting unit 101 will be described below.

Assume here that the first pixel 102 shows light-receiving efficiency X1 for X-polarized light and light-receiving efficiency Y1 for Y-polarized light.

Assume that the second pixel 103 shows light-receiving efficiency X2 for X-polarized light and light-receiving efficiency Y2 for Y-polarized light.

Also assume that the light-receiving intensity of incident light of the first pixel is I1 and that of incident light of the second pixel is I2. Note that the light-receiving intensity is the signal intensity of light received at a pixel including all the polarized components.

Then, the intensity of the X-polarized light Ix of incident light and that of the Y-polarized light Iy of incident light are expressed respectively by formula (1) and formula (2) shown below.

$$Ix = \frac{Y2 \cdot I1 - Y1 \cdot I2}{X1 \cdot Y2 - Y1 \cdot X2} \qquad \text{formula (1)}$$

$$Iy = \frac{X1 \cdot I2 - X2 \cdot I1}{X1 \cdot Y2 - Y1 \cdot X2} \qquad \text{formula (2)}$$

From above, polarization information on incident light can be acquired by way of the light-receiving intensity of the first pixel and that of the second pixel.

Additionally, the polarization splitting characteristic of a solid state image sensor according to the present invention is not degraded if the pixels thereof are downsized because the solid state image sensor utilizes the fact that the coupling efficiency of incident light and an optical waveguide varies as a function of polarized light when the core of each optical waveguide is made to show an oblate cross section.

Furthermore, a solid state image sensor according to the present invention can be prepared by way of a process similar to any known process of manufacturing optical waveguide type solid state image sensors as will be described in greater detail hereinafter. Therefore, a solid state image sensor according to the present invention requires neither an alignment operation that needs to be conducted when inserting a polarization filter nor an additional process so that it can be prepared with ease at low cost.

In this embodiment, the optical waveguide of each pixel is desirably so designed as to show a certain level of sensitivity relative to received light with regard to every polarized component of incident light and hence the light-receiving efficiency is not reduced to nil relative to every polarized component of incident light.

When, on the other hand, a polarization filter is placed on each pixel, the light-receiving efficiency will be reduced to nil to a specific polarized component to consequently degrade the sensitivity of the pixel.

To the contrary, with this embodiment, any specific polarized component of incident light will not be removed by absorption or reflection but will be able to get to the photoelectric converter section of each pixel by way of its core.

Thus, this embodiment can obtain polarization information on light entering any polarized light extracting unit. In other words, the solid state image sensor of this embodiment is highly sensitive relative to polarized light.

Additionally, in this embodiment, the major axis of the core 112 of the first pixel and that of the core 113 of the second pixel are made to show an orthogonal relationship by turning the former major axis by 90° relative to the latter major axis or vice versa.

With this arrangement, the first pixel and the second pixel show the highest light-receiving efficiencies relative to polarized components of incident light that are orthogonal relative to each other.

Incident light to be observed can be split into a specific polarized light and a polarized light that is orthogonal relative to the former light. Thus, as a result of that the polarized light to which the first pixel shows the highest light-receiving efficiency and the polarized light to which the second pixel shows the highest light-receiving efficiency are made to show an orthogonal relationship, polarization information can be acquired efficiently relative to all the polarized light.

Besides, a light-absorbing section is arranged at the clad of each optical waveguide in this embodiment. Then, as a result, light that is not coupled into the optical waveguide and propagated through the clad (in a radiation mode) is prevented from arriving at the photoelectric converter section.

Light in a radiation mode reduces the light-receiving efficiency relative to the orthogonal polarized light and hence gives rise to a large error when acquiring polarization information. Thus, a light-absorbing section is desirably arranged at the clad of each optical waveguide to suppress the radiation mode.

Note, however, that the sensitivity of each pixel is higher when a light-absorbing section is not arranged at the clad of the optical waveguide than when a light-absorbing section is arranged there because incident light is propagated to the photoelectric converter section in the former arrangement.

Therefore, no light-absorbing section may be arranged at the clad of each optical waveguide when the sensitivity of the pixel desirably has priority relative to the error in the obtained polarization information.

The wiring arranged between the first pixel and a pixel disposed next to the first pixel as viewed in the direction of the minor axis of the core of the first pixel is desirably shifted to the side of the first pixel.

The clad has a large thickness in the direction of the minor axis of the core and hence the light-receiving efficiency will not change even if the wiring is shifted to the side of the first pixel.

On the other hand, the vignetting due to the wiring between two adjacently disposed pixels is reduced when the wiring is shifted. Then, as a result, the crosstalk noise will be reduced accordingly.

Note that the core may not necessarily have an oblate cross section, which is elliptic, but may alternatively have a polygonal cross section, which may be rectangular or square.

In any instance, the major axis is the longest one of all the segments of lines passing through the center of the core and connecting the two intersections of the line and the periphery of the core.

The minor axis is the shortest one of all the segments of lines passing through the center of the core and connecting the two intersections of the line and the periphery of the core.

Now, exemplar numerical values of the embodiment will be described below.

The pixel size is 1.5 μm and the core is made of a material showing a refractive index of 2.0 and has an elliptic shape with a half of the major axis equal 500 nm and a half of the minor axis equal to 200 nm.

Examples of material that can be used for the core include SiN and organic materials.

The clad is formed by using a material showing a refractive index of 1.46. Examples of materials that can be used for the clad include $SiO_2$ and organic materials.

The major axis and the minor axis of the ellipse of the first pixel 102 are referred to respectively as X-axis and Y-axis.

Figure 3:
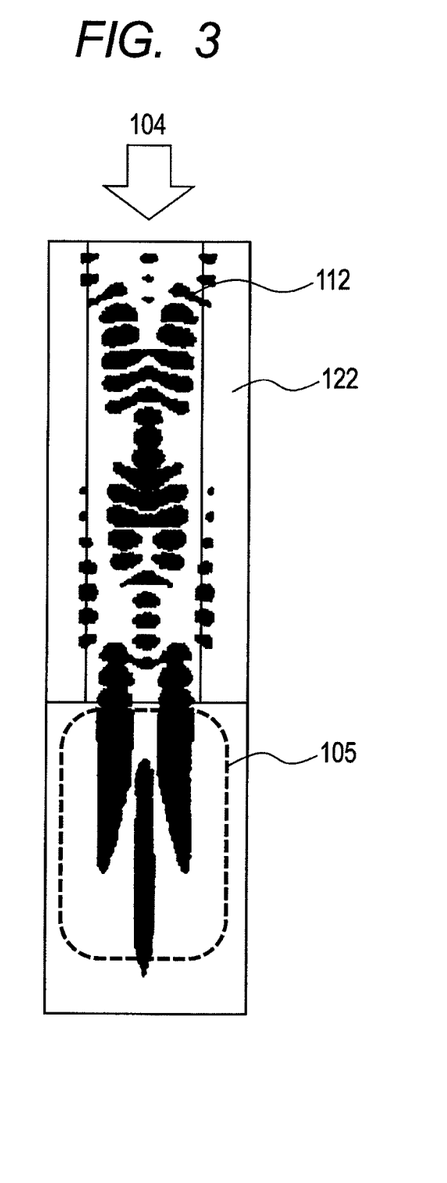
FIG. 3 is a graph illustrating the intensity of Y-polarized light entering the first pixel of the solid state image sensor of the first embodiment and a cross-sectional view taken along the Y-axis of the first pixel.

FIG. 3 illustrates the light intensity of Y-polarized light entering the first pixel and a cross-sectional view of the first pixel taken along the Y-axis. Incident light is efficiently propagated through the core 112 and gets to the photoelectric converter section 105.

Figure 4A:
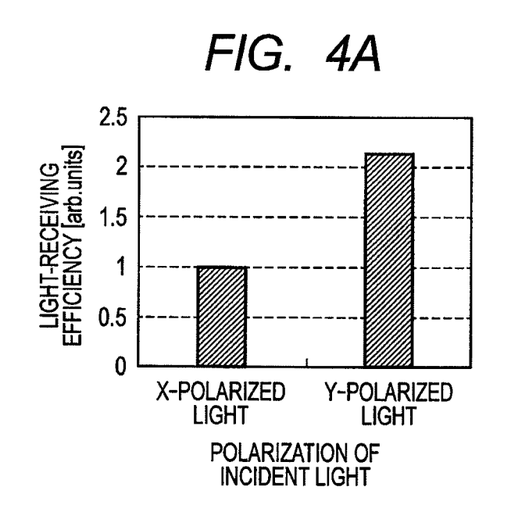
FIG. 4A is a graph illustrating the ratio of the light-receiving efficiency of X-polarized light and that of Y-polarized light of the first pixel and FIG. 4B is a graph illustrating the ratio of the light-receiving efficiency of X-polarized light and that of Y-polarized light of the second pixel.

FIG. 4A illustrates the light-receiving efficiency relative to X-polarized light and the light-receiving efficiency relative to Y-polarized light of the first pixel, which show a ratio of about 1 to 2.

Figure 4B:
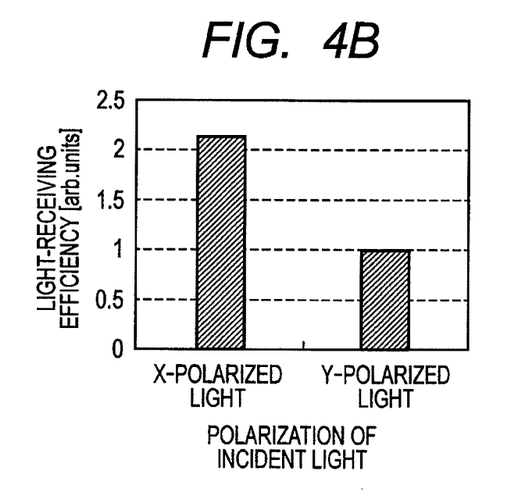

Similarly, the light-receiving efficiency relative to X-polarized light and the light-receiving efficiency relative to Y-polarized light of the second pixel show a ratio of about 2 to 1 (FIG. 4B). Thus, the polarized components of incident light can be determined by calculation, using the formulas (1) and (2) for the first pixel and the second pixel.

Now, the process of manufacturing the solid state image sensor 1 of this embodiment will be described below by referring to FIGS. 5A through 5C.

A silicon oxide film is formed on the surface of a silicon substrate 107 by thermal oxidation (not illustrated).

Subsequently, a resist mask of photoresist is formed at a predetermined position in order to produce a photoelectric converter section 105 in the silicon substrate and impurity ions are implanted into the silicon substrate.

Figure 5A:
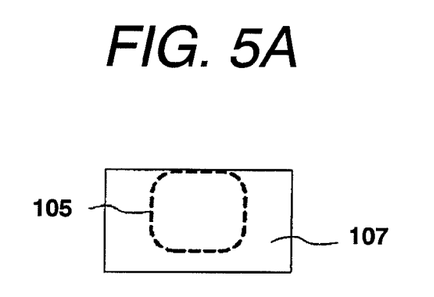
FIGS. 5A, 5B and 5C are schematic illustrations of a process of manufacturing the solid state image sensor according to the first embodiment.

Thereafter, the resist mask is removed typically by means of ashing (FIG. 5A).

Then, a polysilicon film is formed to produce a gate electrode for the purpose of transferring the electric charge generated in the photoelectric converter section 105. Subsequently, the polysilicon film is etched to produce a predetermined pattern by way of a photolithography process. Thus, a gate electrode is formed in the above-described way (not illustrated).

Thereafter, typically an $SiO_2$-based interlayer insulating film is formed on the silicon substrate and also on the gate electrode of each pixel. Additionally, connection holes such as contact holes are formed in the interlayer insulating film for the purpose of electric connections and then necessary electric connections are established by wirings made of some other metal.

Figure 5B:
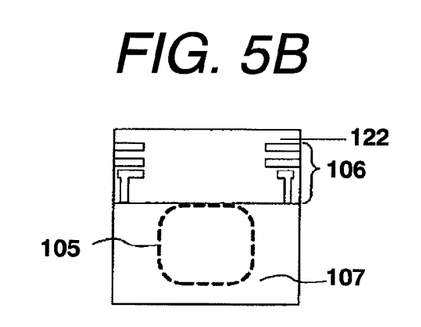
Figure 5C:
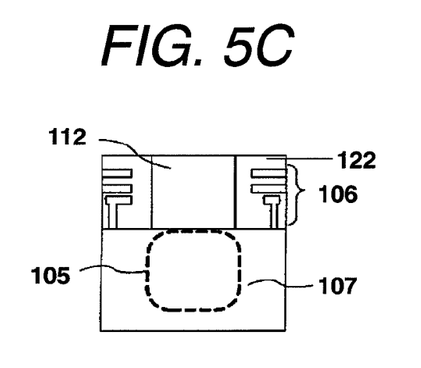

The first wiring and the second wiring are formed in a similar manner and covered by an interlayer insulating film (FIG. 5B). Note, however, that a light-absorbing section 106 is formed to operate also as wiring in this step.

Subsequently, the photoelectric converter section is etched to form a core by way of a photolithography process. Additionally, SiN or an organic material is embedded into the opening part formed by the etching by means of sputtering or CVD that shows a high degree of straight running stability. If necessary, then a flattening operation is conducted by means of CMP or an etching back operation (FIG. 5C).

The core can be made to show any desired shape instead of the oblate shape simply by changing the mask pattern in the photolithography process. Note that a solid state image sensor according to the present invention can be manufactured by way of a manufacturing process similar to any known process of manufacturing an optical waveguide type solid state image sensor without requiring any additional step.

Thereafter, if necessary, a color filter and/or a microlens are formed (not illustrated). With a simple manufacturing process as described above, a solid state image sensor adapted to acquire polarization information can be obtained at low cost.

Second Embodiment

Figure 6:
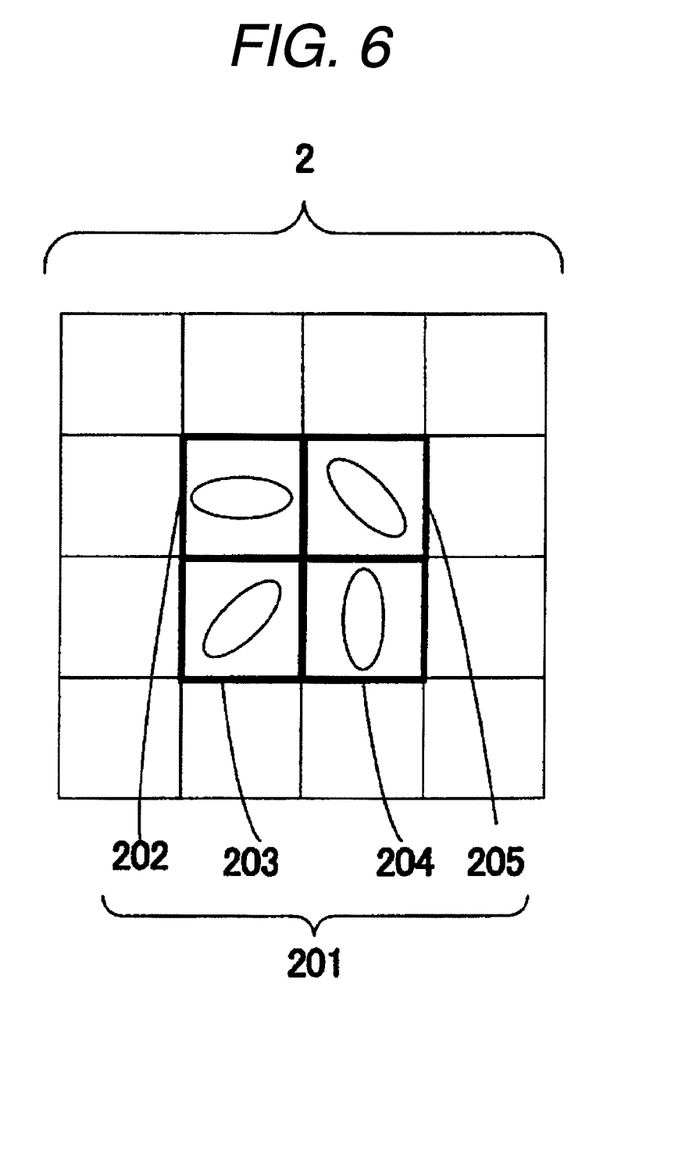
FIG. 6 is a schematic top view of the solid state image sensor including polarized light extracting units according to the second embodiment of the present invention.

Now, second embodiment of solid state image sensor according to the present invention will be described below by referring to FIG. 6, illustrating the configuration thereof different from that of the first embodiment.

This embodiment differs from the first embodiment in terms of polarized light extracting unit 201.

As illustrated in FIG. 6, each polarized light extracting unit 201 of this embodiment is formed by four neighboring pixels including a first pixel 202, a second pixel 203, a third pixel 204 and a fourth pixel 205. The major axes of the elliptic cores of any two adjacent pixels are angularly shifted by 45°.

An exemplar processing method for acquiring polarization information of light entering the polarized light extracting unit 201 will be described below.

Assume that the first pixel, the second pixel, the third pixel and the fourth pixel respectively show light-receiving efficiencies X1, X2, X3 and X4 for X-polarized light and light-receiving efficiencies Y1, Y2, Y3 and Y4 for Y-polarized light.

Also assume that the light-receiving intensity of incident light of the first pixel is I1, that of the second pixel is I2, that of the third pixel is I3 and that of the fourth pixel is I4.

Then, the intensity of the X-polarized light of incident light Ix and that of the Y-polarized light of incident light Iy are expressed respectively by formula (3) and formula (4) shown below.

$$Ix = \frac{1}{2} \cdot \left( \frac{Y2 \cdot I1 - Y1 \cdot I2}{X1 \cdot Y2 - Y1 \cdot X2} + \frac{Y4 \cdot I3 - Y3 \cdot I4}{X3 \cdot Y4 - Y3 \cdot X4} \right) \quad \text{formula (3)}$$

$$Iy = \frac{1}{2} \cdot \left( \frac{X1 \cdot I2 - X2 \cdot I1}{X1 \cdot Y2 - Y1 \cdot X2} + \frac{-X4 \cdot I3 + X3 \cdot I4}{X3 \cdot Y4 - Y3 \cdot X4} \right) \quad \text{formula (4)}$$

Each polarized light extracting unit 201 of this embodiment is formed by four pixels and the major axes of the cores of any two adjacently disposed pixels are made to show a relationship where the former major axis is turned by 45° relative to the latter major axis or vice versa.

With this arrangement, the four pixels show the highest light-receiving sensitivities relative to polarized components of light that are sequentially angularly turned by 45°. Thus, at least one of the four pixels will receive incident light efficiently and each polarized light extracting unit can obtain polarization information more abundantly when compared with a polarized light extracting unit formed by two pixels. Then, this embodiment can acquire polarization information more accurately than the first embodiment with reduced processing steps and observation errors.

Thus, the accuracy of acquired polarization information is improved when the number of pixels of each polarized light extracting unit is increased.

On the other hand, however, the area of each polarized light extracting unit is increased to reduce the number of practically effective pixels and hence the resolution when the number of pixels of each polarized light extracting unit is increased in order to acquire more polarization information.

Therefore, a polarized light extracting unit is desirably formed by four pixels in order to acquire polarization information abundantly and ensure a high resolution.

Third Embodiment

Figure 7:
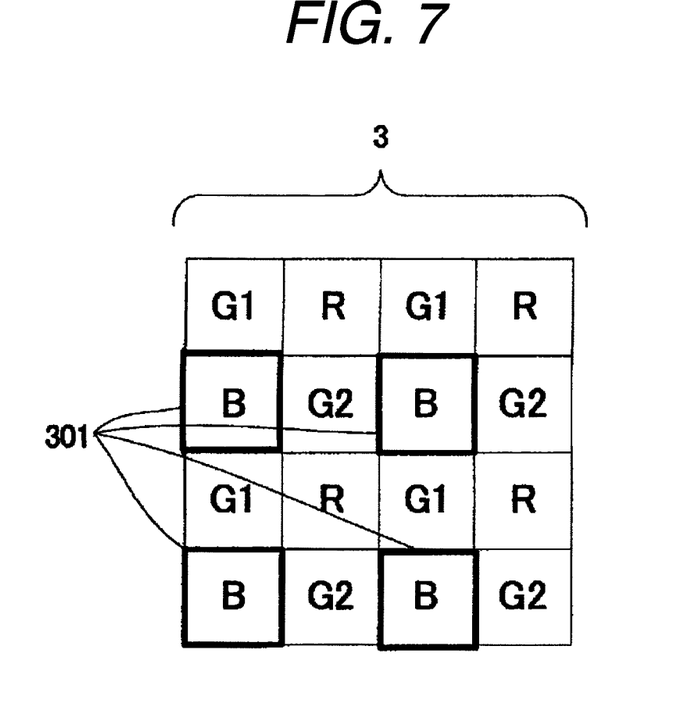
FIG. 7 is a schematic top view of the solid state image sensor including polarized light extracting units according to the third embodiment of the present invention.

Now, third embodiment of solid state image sensor according to the present invention will be described below by referring to FIG. 7, illustrating the configuration thereof different from those of the above-described embodiments.

The solid state image sensor 3 of this embodiment differs from the solid state image sensor of the first embodiment and the second embodiment in terms of polarized light extracting unit 301 and the shape of the core of each optical waveguide.

As illustrated in FIG. 7, each polarized light extracting unit 301 of this embodiment is formed not by four neighboring pixels but by picking up four every other pixels from a block of nine pixels to realize Bayer arrangement. In other words, the selected four pixels that have respective color filters of a same color are separated from each other by arranging one pixel that has a color filter of a different color between any two adjacent ones of the four pixels.

When the Bayer arrangement is employed, the light-receiving efficiencies of different polarized components of incident light need to be measured by a same color filter in order to acquire polarization information for each color filter.

In FIG. 7, Bayer arrangement is realized by using color filters of red (R), green (G1, G2) and blue (B) and the polarized light extracting unit 301 is formed by using blue color filters.

Polarized light extracting units can be formed for R, G1 and G2 in a similar manner. With the above-described arrangement of the polarized light extracting unit 301, polarization information can be obtained for each color with a pixel arrangement using color filters.

Figure 8A:
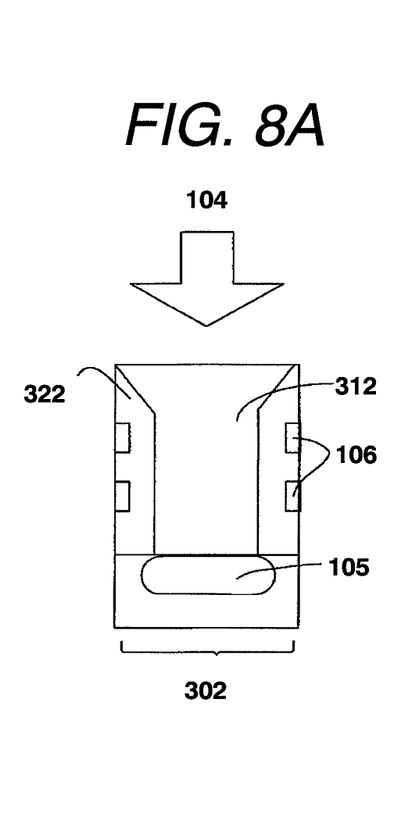
FIG. 8A is a schematic cross-sectional view of the first pixel and FIG. 8B is a schematic cross-sectional view of the second pixel.
Figure 8B:
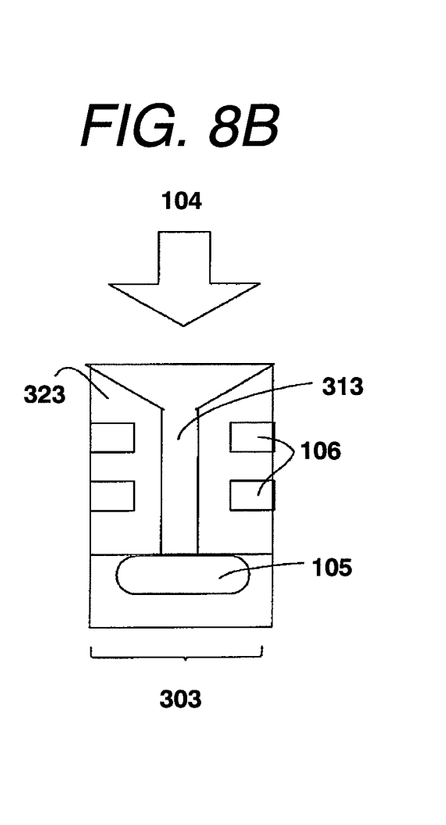

FIG. 8A is a schematic cross-sectional view of the first pixel 302 of the polarized light extracting unit 301. FIG. 8B is a schematic cross-sectional view of the second pixel 303.

The first pixel and the second pixel have their optical waveguides respectively including cores 312 and 313 and clads 322 and 323.

Each of the cores shows an oblong cross section having a tapered part so as to be gradually broadened to the full width of the pixel at the light receiving side.

As the core is made to have a tapered part, the mode of operation of reflecting light at the interface of the optical waveguide is reduced so that incident light can be efficiently coupled into the optical waveguide.

Thus, the pixels in the polarized light extracting unit can provide a sufficient light-receiving efficiency. Note, however, that a condensing lens such as microlens may be used in addition to the tapered part of the core in order to raise the coupling efficiency of the incident light and the optical waveguide.

Then, the polarized light extracting unit can acquire polarization information of light entering it when the core of the first pixel and that of the second pixel show an oblate (oblong) cross section and the major axis of the core of the first pixel and that of the core of the second pixel are angularly turned from each other.

Fourth Embodiment

Figure 9:
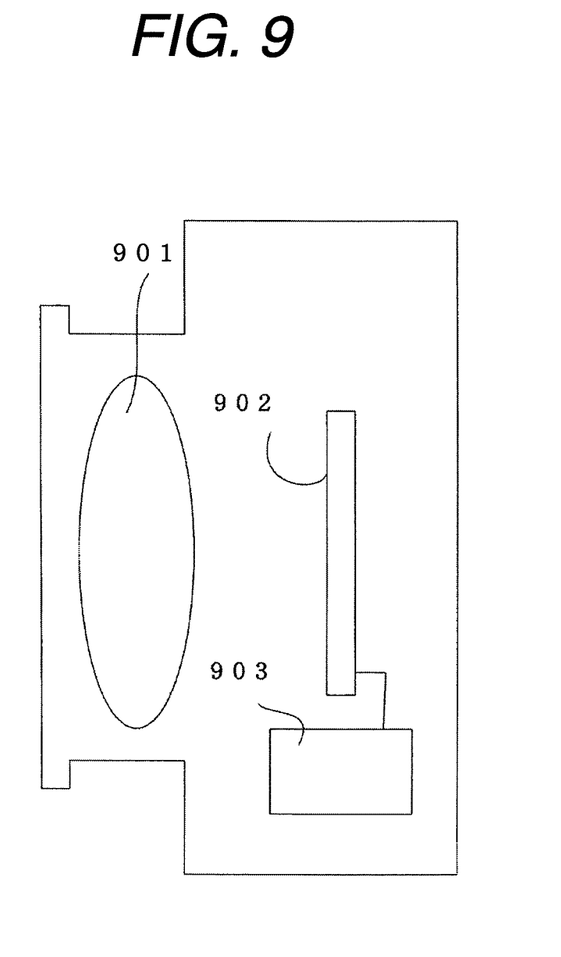
FIG. 9 is a schematic illustration of a digital camera formed by using a solid state image sensor according to the present invention.

A digital camera formed by using a solid state image sensor according to the present invention will be described below as the fourth embodiment of the invention. FIG. 9 is a schematic illustration of the digital camera.

FIG. 9 illustrates an image pickup lens 901, a solid state image sensor 902 according to the present invention and an arithmetic section 903. An image of a subject is formed in the solid state image sensor 902 by way of the image pickup lens 901 and the arithmetic section 903 executes an arithmetic process on the electric signals generated in the solid state image sensor to form an image to be displayed.

Since a solid state image sensor according to the present invention can sense various pieces of polarization information, the digital camera can acquire an image with ease by controlling polarized light without using polarization filter.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2010-257250, filed Nov. 17, 2010, which is hereby incorporated by reference herein in its entirety.

What is claimed is:

1. A solid state image sensor that has an extracting unit comprising a plurality of pixels, each having an optical waveguide formed by a core and a clad for guiding incident light entering a pixel to a photoelectric converter section via the core,
   the extracting unit being formed by at least two pixels including a first pixel and a second pixel, cores in optical waveguides of the first and second pixels being designed to show an oblate cross section and arranged with their respective major axes disposed in different directions;
   the extracting unit being designed to show a light-receiving efficiency varying as a function of polarization state of incident light entering the first and second pixels.

2. The solid state image sensor according to claim 1, wherein
   the optical waveguides are designed to prevent any specific polarized component of incident light from being absorbed or reflected and removed, and to allow the polarized component to get to the photoelectric converter sections via the cores.

3. The solid state image sensor according to claim 1, wherein
   the respective major axes are made to show an orthogonal relationship.

4. The solid state image sensor according to claim 1, wherein
   each clad of the optical waveguides of the first and second pixels has a light-absorbing section for preventing light being propagated through the clad from being coupled into the optical waveguide and allowing the light to get to the photoelectric converter section.

5. The solid state image sensor according to claim 4, wherein:
   the light-absorbing section is designed to operate as wiring; and
   the wiring arranged between the first pixel and the second pixel disposed next to the first pixel as viewed in a direction of a minor axis of the core is shifted to a side of the first pixel.

6. The solid state image sensor according to claim 1, wherein
   the extracting unit is formed by four pixels and the major axes of the cores of any two adjacent pixels thereof are angularly shifted by 45°.

7. The solid state image sensor according to claim 1, wherein
   the extracting unit is formed by pixels having respective color filters and four neighboring pixels having respective color filters of a same color are separated from each other by arranging one pixel that has a color filter of a different color between any two adjacent ones of the four pixels.

8. A camera including an image pickup lens, a solid state image sensor according to claim 1 and an arithmetic processing section.

9. The camera according to claim 8, wherein
   the optical waveguides of the solid state image sensor are designed to prevent any specific polarized component of incident light from being absorbed or reflected and removed, and to allow the polarized component to get to the photoelectric converter sections via the cores.

10. The camera according to claim 8, wherein, in the solid state image sensor,
    the respective major axes sensor are made to show an orthogonal relationship.

11. The camera according to claim 8, wherein, in the solid state image sensor,
    each clad of the optical waveguides of the first and second pixels has a light-absorbing section for preventing light being propagated through the clad from being coupled into the optical waveguide and allowing the light to get to the photoelectric converter section.

12. The camera according to claim 11, wherein, in the solid state image sensor,
    the light-absorbing section is designed to operate as wiring, and
    the wiring arranged between the first pixel and the second pixel disposed next to the first pixel as viewed in a direction of a minor axis of the core is shifted to a side of the first pixel.

13. The camera according to claim 8, wherein, in the solid state image sensor,
    the extracting unit is formed by four pixels and the major axes of the cores of any two adjacent pixels thereof are angularly shifted by 45°.

14. The camera according to claim 8, wherein, in solid state image sensor,
    the extracting unit is formed by pixels having respective color filters and four neighboring pixels having respective color filters of a same color are separated from each other by arranging one pixel that has a color filter of a different color between any two adjacent ones of the four pixels.

* * * * *